United States Patent
Shim

(10) Patent No.: US 7,892,896 B2
(45) Date of Patent: Feb. 22, 2011

(54) SEMICONDUCTOR DEVICE HAVING BULB-SHAPED RECESS GATE AND METHOD FOR FABRICATING THE SAME

(75) Inventor: Sang-Oak Shim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/717,049

(22) Filed: Mar. 3, 2010

(65) Prior Publication Data

US 2010/0159654 A1    Jun. 24, 2010

Related U.S. Application Data

(62) Division of application No. 11/725,933, filed on Mar. 19, 2007, now Pat. No. 7,700,979.

(30) Foreign Application Priority Data

Mar. 21, 2006   (KR)   ............................ 2006-0025821

(51) Int. Cl.
*H01L 21/331* (2006.01)
(52) U.S. Cl. .................. 438/138; 438/156; 438/173; 438/192; 438/206; 257/E21.383
(58) Field of Classification Search .................. 438/138, 438/156, 173, 192, 206, 212; 257/E21.383
See application file for complete search history.

(56) References Cited

U.S. PATENT DOCUMENTS

| 5,112,771 | A  | * | 5/1992  | Ishii et al. ................... 438/389 |
| 5,747,839 | A  | * | 5/1998  | Hammond et al. .......... 257/253 |
| 5,892,252 | A  | * | 4/1999  | Hammond et al. .......... 257/252 |
| 6,551,944 | B1 | * | 4/2003  | Fallica et al. ................. 438/719 |
| 6,600,189 | B1 | * | 7/2003  | Sato et al. ................... 257/301 |
| 6,770,535 | B2 | * | 8/2004  | Yamada et al. .............. 438/270 |
| 7,291,532 | B2 | * | 11/2007 | Tegen .......................... 438/256 |
| 7,560,359 | B2 | * | 7/2009  | Park ........................... 438/426 |
| 2001/0023960 | A1 | * | 9/2001 | Soga et al. ................... 257/330 |
| 2004/0110383 | A1 | * | 6/2004 | Tanaka ........................ 438/700 |

FOREIGN PATENT DOCUMENTS

| KR | 1020060023308 | 3/2005 |
| KR | 10-2006-0023308 | 3/2006 |

* cited by examiner

*Primary Examiner*—Victor A Mandala
(74) *Attorney, Agent, or Firm*—Blakely, Sokoloff, Taylor & Zafman LLP

(57) ABSTRACT

A semiconductor device includes: a substrate; a first junction region and a second junction region formed separately from each other to a certain distance in the substrate; an etch barrier layer formed in the substrate underneath the first junction region; and a plurality of recess channels formed in the substrate between the first junction region and the second junction region.

14 Claims, 4 Drawing Sheets

SEMICONDUCTOR DEVICE HAVING BULB-SHAPED RECESS GATE AND METHOD FOR FABRICATING THE SAME

Cross-Reference to Related Application: The present patent application is a Divisional application claiming the benefit of application Ser. No. 11/725933, filed Mar. 19, 2007, which is now U.S. Pat. No. 7,700,979.

BACKGROUND OF THE INVENTION

The present invention relates to a method for fabricating a semiconductor device, and more particularly, to a method for fabricating a semiconductor device having a bulb-shaped recess gate.

As for a typical method for forming a planar gate interconnection line by forming a gate over a flat active region, the current large integration scale of semiconductor devices has caused a channel length to be decreased but an implantation doping concentration to be increased. Accordingly, due to an increased electric field, a junction leakage is generated and thus, it becomes difficult to secure a satisfactory refresh property of a device.

A recess gate process has been suggested to overcome the above described limitations as a method for fabricating a gate interconnection line. The recess gate process forms a gate after etching an active region of a substrate to form a recess pattern. If the recess gate process is applied, the channel length is increased and the implantation doping concentration is decreased. Accordingly, the refresh property of the device can be improved. However, if the recess gate process is employed, a depth of the recess may not be increased enough to completely improve the refresh property. Therefore, a method for fabricating a bulb-shaped recess gate with a rounded and wider bottom portion has been introduced.

FIG. 1 illustrates a typical semiconductor device having a bulb-shaped recess gate. A plurality of device isolation layers 12 are formed in a substrate 11, and the substrate 11 is locally and selectively etched to form a plurality of bulb-shaped recess channels 13.

Each or the recess channels 13 is formed in a symmetrical bulb shape. Accordingly, a threshold voltage variation increasing due to a horn effect may be reduced, and a channel length may be secured.

However, the bulb-shaped recess channels 13 do not secure sufficient spacing between gate patterns. Due to the insufficient spacing between the gate patterns, the gate patterns may cling to each other and thus, a critical limitation may be caused on a device.

SUMMARY OF THE INVENTION

Embodiments of the present invention are directed toward providing a method for fabricating a semiconductor device having a bulb-shaped recess gate capable of reducing a limitation generated on a device since gate patterns cling to each other due to insufficient spacing during forming the bulb-shaped recess gate.

In accordance with one aspect of the present invention, there is provided a semiconductor device, including: a substrate; a first junction region and a second junction region formed separately from each other to a certain distance in the substrate; an etch barrier layer formed in the substrate underneath the first junction region; and a plurality of recess channels formed in the substrate between the first junction region and the second junction region.

In accordance with another aspect of the present invention, there is provided a method for fabricating a semiconductor device, including: forming a first junction region and a second junction region separately from each other to a certain distance in a substrate; forming an etch barrier layer in the substrate underneath the first junction region; and forming a plurality of recess channels in the substrate between the first and second junction regions.

DESCRIPTION OF SPECIFIC EMBODIMENTS

Figure 1:
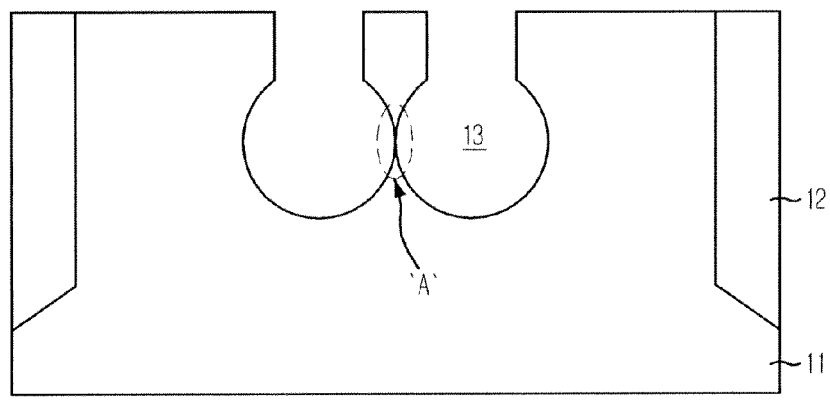
FIG. 1 illustrates a semiconductor device having a typical bulb-shaped recess gate.
Figure 2:
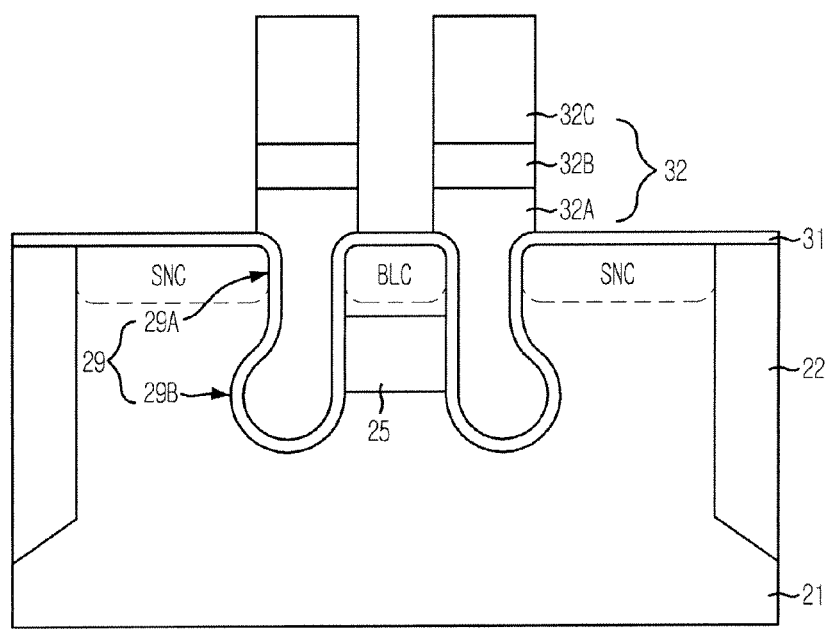
FIG. 2 illustrates a semiconductor device having a bulb-shaped recess gate in accordance with an embodiment of the present invention.

FIG. 2 illustrates a semiconductor device having a bulb-shaped recess gate in accordance with an embodiment of the present invention. A plurality of device isolation layers 22 are formed in a substrate 21. A nitrogen implantation layer 25 is formed underneath a bit line contact (BLC) region. A plurality of recesses 29 are formed between the BLC region and storage node contact (SNC) regions. The recesses 29 include first recesses 29A formed in vertical profiles and second recesses 29B formed in asymmetric bulb shape. A gate insulation layer 31 is formed over an entire surface of the substrate 21 including the first and second recesses 29A and 29B. A plurality of gate patterns 32 of which first portions are buried into the first and second recesses 29A and 29B, and second portions are projected over the substrate 21.

As described above, the nitrogen implantation layer 25 formed before the formation of the recesses 29 creates a difference in an etch rate. Due to the difference in the etch rate, portions contacting the nitrogen implantation layer 25 are formed in the vertical profiles, and the other portions facing the nitrogen implantation layer 25 are formed in the asymmetric bulb shapes. As a result, spacing between gate patterns can be secured.

Figure 3A:
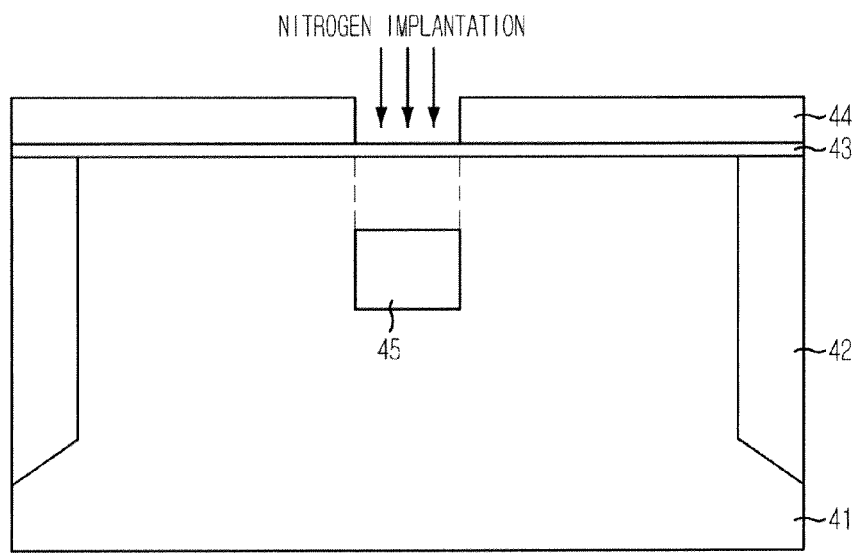
FIGS. 3A to 3F illustrate a method for fabricating a semiconductor device having a bulb-shaped recess gate in accordance with another embodiment of the present invention.

FIGS. 3A to 3F illustrate a method for fabricating a semiconductor device having a bulb-shaped recess gate in accordance with another embodiment of the present invention. As shown in FIG. 3A, a plurality of device isolation layers 42 are formed in a semi-finished substrate 41 to a thickness larger than that of recesses to be subsequently formed. The device isolation layers 42 define an active region.

A pad oxide layer 43 is formed over the semi-finished substrate 41. An ion-implantation mask 44 exposing a nitrogen implantation region is formed over the pad oxide layer 43. The pad oxide layer 43 is formed of a thermal oxide layer. The ion implantation mask 44 is formed from a photoresist pattern to expose an upper portion of a first junction region.

Nitrogen is implanted to the nitrogen implantation region using the ion implantation mask 44 to form a nitrogen implantation layer 45 underneath the first junction region of the semi-finished substrate 41. The nitrogen implantation layer 45 serves as an etch barrier to form subsequent bulb-shaped recess channels asymmetrically using a difference in an etch rate during forming the subsequent bulb-shaped recess channels. Then, the ion implantation mask 44 is removed using oxygen plasma.

Figure 3B:
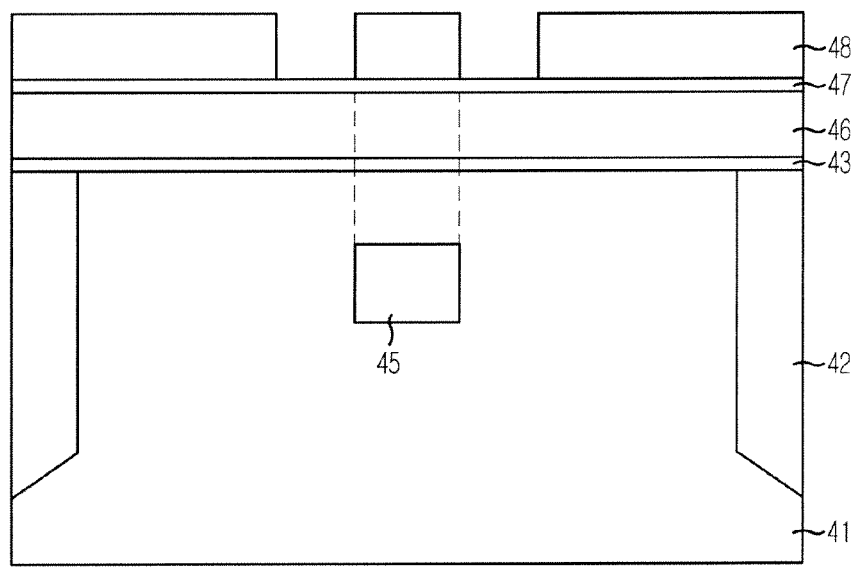

As shown in FIG. 3B, a hard mask layer 46, an anti-reflective coating layer 47, and a photoresist pattern 48 are formed over the pad oxide layer 43. The photoresist pattern 48 exposes regions where the subsequent recesses are to be formed.

The hard mask layer 46 is formed of amorphous carbon, and the anti-reflective coating layer 47 is formed of silicon oxynitride (SiON). The edges of the photoresist pattern 48, which defines the recess regions, are arranged to coincide with the edges of the nitrogen implantation layer 45.

Figure 3C:
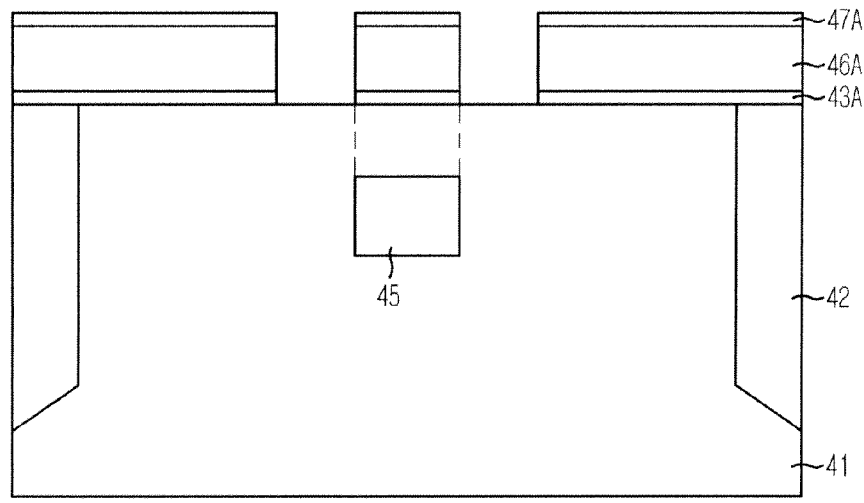

As shown in FIG. 3C, the anti-reflective coating layer 47, the hard mask layer 46, and the pad oxide layer 43 are patterned using the photoresist pattern 48. As a result, a patterned anti-reflective coating layer 47A, a hard mask pattern 46A, and a patterned pad oxide layer 43A are obtained. Then, the photoresist pattern 48 is removed via a dry etching process. The dry etching process includes using oxygen plasma.

Figure 3D:
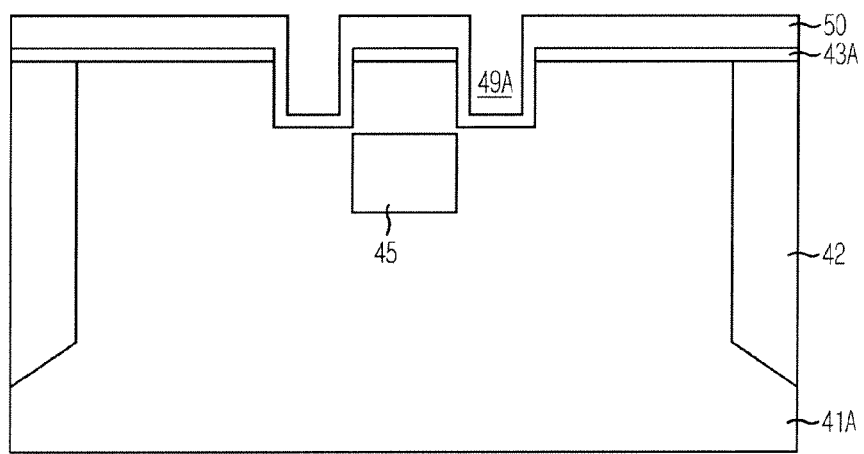

As shown in FIG. 3D, the semi-finished substrate 41 is patterned using the hard mask pattern 46A as an etch mask to form a plurality of first recesses 49A. Reference numeral 41A identifies a first patterned substrate. When the first recesses 49A are formed, the patterned anti-reflective coating layer 47A and the hard mask pattern 46A are removed. A portion of the hard mask pattern 46A which may still remain can be removed using oxygen plasma.

A spacer insulation layer 50 is formed over an entire surface of the above resultant structure including the first recesses 49A. The spacer insulation layer 50 is formed of an oxide layer. A thickness of the spacer insulation layer 50 formed over an upper portion of the first patterned substrate 41A is larger than that of the spacer insulation layer 50 formed on sidewalls and bottom portions of the first recesses 49A.

Figure 3E:
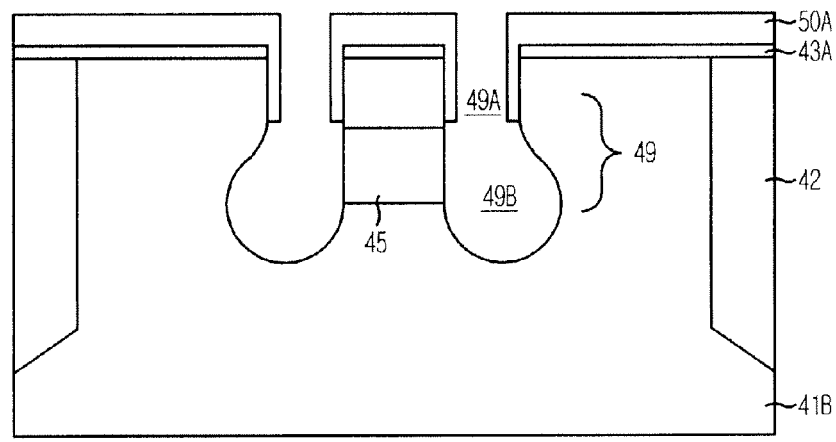

As shown in FIG. 3E, the spacer insulation layer 50 formed over the bottom portions of the first recesses 49A and portions of the first patterned substrate 41A are patterned using the spacer insulation layer 50 formed over the sidewalls of the first recesses 49A and the upper portion of the first patterned substrate 41A. As a result, a plurality of second recesses 49B having larger widths and rounded bottom portions than the first recesses 49A are formed. A reference numeral 41B identifies a second patterned substrate, and a reference numeral 50A identifies a patterned spacer insulation layer.

An isotropic etching process is performed to form the second recesses 49B. However, an etch rate of silicon in which the nitrogen implantation layer 45 is formed is much slower than remaining portions of the second patterned substrate 41B. As a result, one portions of the second recesses 49B contacting the nitrogen implantation layer 45 are patterned in vertical profiles. The other portions of the second recesses 49B facing the nitrogen implantation layer 45 and bottom portions of the second recesses 49B are patterned in rounded profiles.

Accordingly, the first recesses 49A and the second recesses 49B forms asymmetric bulb-shaped recess channels 49. Due to the formation of the asymmetric bulb-shaped recess channels 49, spacing between gate patterns can be secured as much as a thickness of the nitrogen implantation layer 45. Thus, a refresh property can be improved.

Figure 3F:
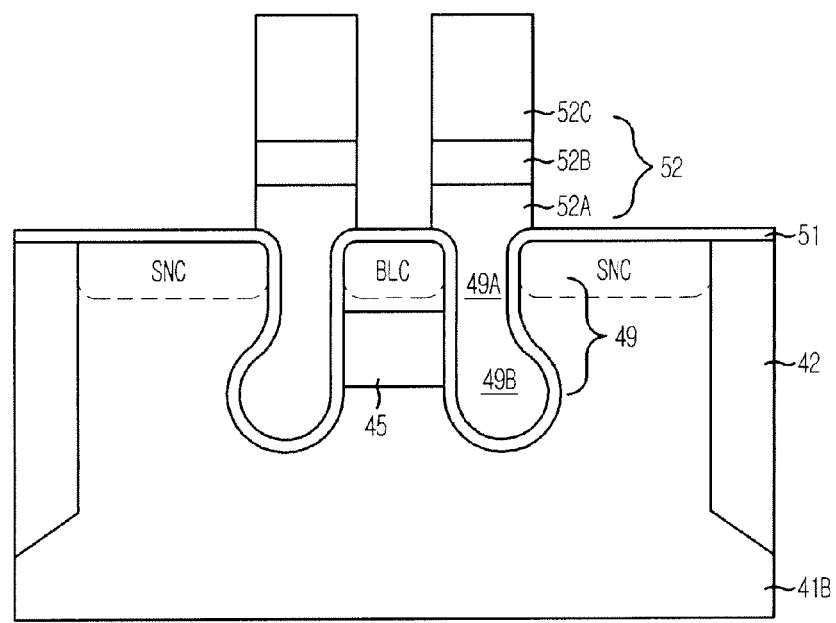

As shown in FIG. 3F, a rounding process is performed to an entire surface of the resultant structure including the recess channels 49. Then, a wet cleaning process is performed to remove the patterned pad oxide layer 43A and the patterned space insulation layer 50A. The wet cleaning process includes using hydrogen fluoride (HF) or buffered oxide etchant (BOE).

A gate insulation layer 51 is formed over an entire surface of the recess channels 49. A plurality of gate patterns 52 of which first portions are buried into the recess channels 49 and second portions are projected over upper portions of the second patterned substrate 41B. Each of the gate patterns 52 is formed sequentially stacking a polysilicon electrode 52A, a metal electrode 52B, and a gate hard mask layer 52C. The metal electrode 52B includes using one of tungsten and tungsten silicide. The gate hard mask layer 52C includes using a nitride layer.

According to the embodiment of the present invention, the nitrogen implantation layer is formed underneath the first junction region of the substrate before the bulb-shaped recesses are formed. The nitrogen implantation layer creates the difference in an etch rate. As a result, the asymmetric bulb-shaped recess channels can be formed using the difference in the etch rate, thereby securing spacing margin between the gate patterns.

The channel length can be increased as well. Thus, the refresh property can be improved and the device reliability can be secured.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first junction region and a second junction region separately from each other in a substrate;
    forming an etch barrier layer in the substrate underneath the first junction region; and
    forming a plurality of recess channels in the substrate between the first and second junction regions,
    wherein the recess channels comprise first and second recesses, each of the second recesses formed having, an asymmetric bulb shape on a vertical axis with respect to the substrate.

2. The method of claim 1, wherein forming the recess channels comprises forming the first recesses each in a vertical profile with at least the same thickness as that of the first and second region and the second recesses are formed in a portion of the substrate deeper than the first and second junction regions.

3. The method of claim 2, wherein forming the recess channels each comprises forming a first portion contacting the etch barrier layer in a vertical profile and forming a second portion not contacting the etch barrier layer in a round profile.

4. The method of claim 1, wherein forming the etch barrier layer comprises forming a nitrogen implantation layer.

5. The method of claim 4, wherein forming the etch barrier layer comprises:
    forming a pad oxide layer over the substrate;
    forming a mask pattern over the pad oxide layer;
    implanting nitrogen into the substrate underneath the first junction region using the mask pattern as an ion implantation mask to form a nitrogen implantation layer; and
    removing the mask pattern.

6. The method of claim 5, wherein the mask pattern includes a photoresist material.

7. The method of claim 5, wherein removing the mask pattern comprises using oxygen plasma.

8. The method of claim 1, wherein forming the recess channels comprise:
    forming a pad pattern over the substrate, the pad pattern including a patterned pad oxide layer and a hard mask exposing regions where the recess channels are to be formed on both sides of the etch barrier layer;

etching the substrate using the pad pattern to form first recesses;

forming a spacer insulation layer over a resultant surface profile obtained after forming the first recesses; and etching the spacer insulation layer formed over bottom portions of the first recesses and the substrate underneath the first recesses to form second recesses.

9. The method of claim 8, wherein the hard mask includes amorphous carbon, and is removed when the first recesses are formed.

10. The method of claim 8, wherein the hard mask includes amorphous carbon, and a portion of the hard mask is removed using oxygen plasma.

11. The method of claim 8, wherein the spacer insulation layer includes an oxide-based layer, and a portion of the spacer insulation layer formed over an upper portion of the substrate is formed thicker than another portion of the spacer insulation layer formed over sidewalls and bottom portions of the first recesses.

12. The method of claim 8, after forming the second recesses, further comprising:

rounding a surface profile of the first and second recesses;

removing the patterned pad oxide layer and the spacer insulation layer; and forming a plurality of gate patterns each of which first portion fills recess channels including the first and second recesses and a second portion is projected over an upper portion of the substrate.

13. The method of claim 12, wherein removing the patterned pad oxide layer and the spacer insulation layer comprises performing a wet etching process.

14. The method of claim 13, wherein performing the wet cleaning process comprises using one of hydrogen fluoride (HF) and buffered oxide etchant (BOE).

* * * * *